United States Patent [19]
Powell et al.

[11] Patent Number: 5,959,912
[45] Date of Patent: Sep. 28, 1999

[54] ROM EMBEDDED MASK RELEASE NUMBER FOR BUILT-IN SELF-TEST

[75] Inventors: Theo J. Powell, Dallas, Tex.; Kuong Hua Hii, Singapore, Singapore; Danny R. Cline, Plano; Wah Kit Loh, Richardson, both of Tex.

[73] Assignee: Texas Instruments Incorporated, Dallas, Tex.

[21] Appl. No.: 09/005,359

[22] Filed: Jan. 9, 1998

Related U.S. Application Data

[63] Continuation-in-part of application No. 08/846,922, Apr. 30, 1997.

[51] Int. Cl.[6] .................................................. G11C 7/00
[52] U.S. Cl. .................................................................. 365/201
[58] Field of Search .................................... 365/201, 103, 365/94; 395/183; 371/21.2

[56] References Cited

U.S. PATENT DOCUMENTS

| | | | |
|---|---|---|---|
| 4,419,747 | 12/1983 | Jordan | 365/201 |
| 4,451,903 | 5/1984 | Jordan | 365/94 |
| 5,103,166 | 4/1992 | Jeon et al. | 324/158 R |
| 5,258,986 | 11/1993 | Zerbe | 371/21.2 |
| 5,506,959 | 4/1996 | Cockburn | 395/183.13 |
| 5,642,307 | 6/1997 | Jernigan | 365/103 |
| 5,675,545 | 10/1997 | Madhavan et al. | 365/201 |
| 5,787,174 | 7/1998 | Tuttle | 380/23 |
| 5,818,772 | 10/1998 | Kuge | 365/201 |

*Primary Examiner*—David Nelms
*Assistant Examiner*—Anh Phung
*Attorney, Agent, or Firm*—Robby T. Holland; Carlton H. Hoel; Richard L. Donaldson

[57] ABSTRACT

A read-only memory (ROM) embedded mask release number for a built-in self-test of a memory device is provided. A synchronous dynamic random access memory (10) comprises a conventional memory (12) and a built-in self-test arrangement (14). The built-in self-test arrangement (14) includes a read only memory (ROM) (72) which stores a plurality of algorithms. Each algorithm is comprised of a series of array access instructions (140) and program access instructions (142). The last instruction in ROM (72) is an idle instruction (120). Associated with idle instruction (120) is an identification number (132). Once stored in ROM (72), the identification number (132) can be read without the use of additional equipment.

2 Claims, 3 Drawing Sheets

ROM EMBEDDED MASK RELEASE NUMBER FOR BUILT-IN SELF-TEST

RELATED APPLICATIONS

This application is a continuation-in-part application of pending U.S. patent application Ser. No. 08/846,922, filed Apr. 30, 1997, assigned to the same party.

TECHNICAL FIELD OF THE INVENTION

This invention relates to the field of built-in self-tests for memory systems and more specifically to a ROM embedded mask release number for built-in self-test.

BACKGROUND OF THE INVENTION

In conventional testing of memory device, an external tester supplies control signals such as column address (CAS), row address (RAS), write enable (WE), address signals, and data to the device under test. Outputs from the device under test are sampled by the tester to determine whether the device passes or fails. As memory device density increases, testing time also increases. This increased testing time increases the manufacturing cost of integrated circuit memory devices.

In order to decrease the time it takes to test high density memory devices, parallel read and write schemes have been implemented. One drawback of implemented parallel read and write schemes is that an external tester is required. Also, parallel leads required to test the memory devices in parallel occasionally fail due to cross talk among the leads.

To avoid the drawbacks of parallel read and write schemes, built-in self-test arrangements have been used. The built-in self-test arrangement includes a read only memory that stores test algorithm instructions. The read only memory eliminates the need for external testers as well as parallel leads. However, these built-in self-test arrangements do not provide for the ability to place a Mask Release Number into the Read-Only-Memory (ROM) used to run the built-in self-test algorithms. Instead, mask or chip numbers are stored in a special registered that require extra pins and equipment to read. Therefore, it is desirable to facilitate placement of a mask release number into a read only memory of a memory device.

SUMMARY OF THE INVENTION

Accordingly, it may be appreciated that a need has arisen for a ROM embedded mask release number for a built-in self-test of a memory device. In accordance with the present invention, a ROM embedded mask release number for a built-in self-test of a memory device is provided which substantially eliminates or reduces disadvantages and problems associated with current mask release number storage techniques.

In one embodiment of the present invention, a memory system for storing identification information is provided. The memory systems comprises an area of random access memory area as well as a built-in self-test area operable to perform diagnostic tests on the memory area. The built-in self-test includes a read only memory area which contains a plurality of instructions. At least one instruction is an idle instruction that includes identification information associated with the idle instruction.

In another embodiment a method for providing identification information in an integrated circuit is provided. This method comprises the steps of providing a fixed amount of non-volatile memory, providing an idle instruction in the memory, and associating the idle instruction with the identification information.

The present invention provides various technical advantages over current mask release number storage techniques. For example, one technical advantage is storing a Mask Release Number in the ROM used for self-testing. Another technical advantage is the Mask Release Number can be read without the addition of any physical mechanism such as test interface or additional pins. Other technical advantages may be readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, in which like reference numbers represent like parts, in which.

DETAILED DESCRIPTION OF THE INVENTION

Figure 1:
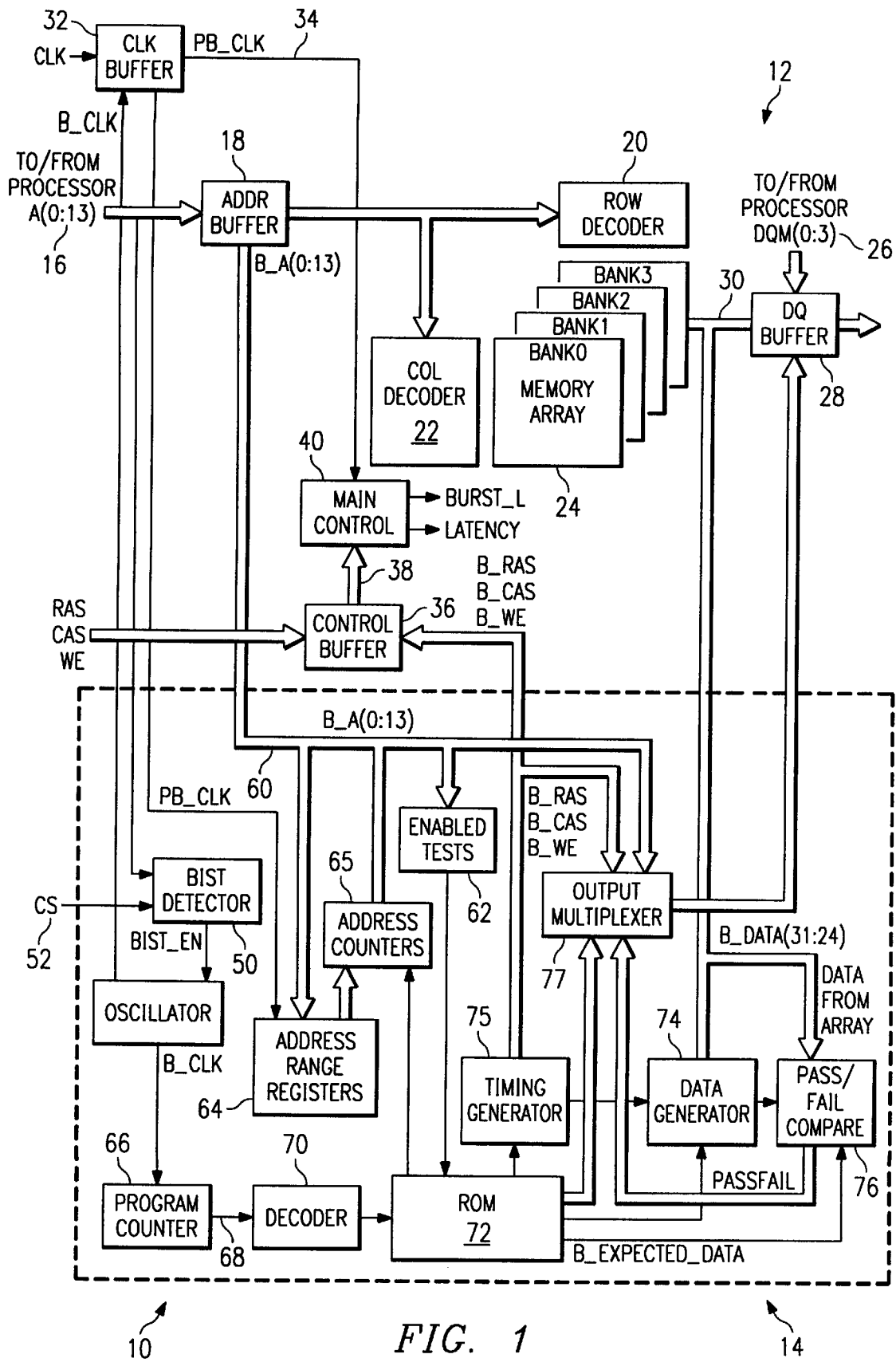
FIG. 1 illustrates a synchronous dynamic random access memory (SDRAM) with a built-in self-test device.

FIG. 1 illustrates a synchronous dynamic random access memory (SDRAM) 10 with built-in self-test device 10 in accordance with the teachings of the present invention. SDRAM 10 comprises a conventional memory 12 and a built-in self-test arrangement 14.

Conventional memory 12, in one embodiment, operates as a conventional synchronous dynamic random access memory during normal operation. In test operations, built-in self-test arrangement 14 operates in a self-test mode. All test signals are generated internally to SDRAM 10.

In normal mode, conventional memory 12 operates like a well-known synchronous dynamic random access memory device. A digital processor, such as a microprocessor (not shown) produces row and column address. The row and column addresses are provided on an address bus 16 in a time division multiplexed format for storage in an address buffer 18. After receiving a control signal from the digital processor, the row address and column address are decoded either by row decoder 20 or column decoder 22.

Depending upon the state of the write enable signal, WE, from the digital processor, data is either written into or read out from storage cells located in the banks of a memory array 24. Data which is written into memory array 24 is entered by way of data bus 26. In-coming data is buffered in a data buffer 28 and forwarded to memory array 24 by an internal data bus 30 where it is stored until it is written over or not properly refreshed. Data stored in memory array 24 can be addressed and read out of memory array 24 via internal data bus 30 and data buffer 28 to data bus 26. Typically, data bus 26 is connected to the data receiving and sending terminals of a digital processor such as a microprocessor.

Conventional memory 12, in one embodiment, is a synchronous dynamic random access memory and therefore relies on a system clock for synchronizing its operation with the digital processor, peripheral devices, and control circuitry connected to SDRAM 10. A clock signal CLK is applied to a clock buffer 32 which outputs an internal clock signal 34 for operating memory array 24 during normal operation.

The digital processor applies control signals CAS, RAS, and WE to a control signal buffer 36. During normal operation, these control signals pass through control buffer 36, over to a control bus 38 to a main control unit 40 or for access to memory array 24 through row decoder 20 and column decoder 22. During normal operations, internal system clock signal 34 and the control signals control operation of memory array 24.

The self-test mode is entered if special signal conditions are applied at power up of SDRAM 10. Typically, to initiate the self-test mode, a DC signal will be applied externally to SDRAM 10. In one example, an overvoltage signal to a specific address pin (such as pin A4) of SDRAM 10 would place SDRAM 10 in a self-test condition. Once an overvoltage is applied to a specific pin, a built-in self-test detector circuit 50 responds to this overvoltage by placing built-in self-test arrangement 14 into the self-test mode.

In the self-test mode, built-in self-test arrangement 14 prepares for testing by gathering information on what test to run. The self-test mode is exited when another input is applied to an address lead. In one embodiment, that input applies a high level to control signal 52 (CS) at built-in self-test detector circuit 50. In this embodiment, the self-test mode will be active as long as control signal 52 remains at a high level state. Once control signal 52 falls to a low level state, the self-test mode is exited. Further description of the arrangement and operation of built-in self-test detector 50 can be found in copending U.S. application Ser. No. 08/840,428 (TI-22640), hereby incorporated by reference herein.

Upon entering the self-test mode, built-in self-test detector 50 sends a BIST_EN signal to an oscillator 58. In response to the BIST_EN signal, oscillator 58 generates a clock signal B_CLK that is applied to a clock buffer 32 in order to take control of clock buffer 32. Alternatively, an external clock scheme may be used. The internal/external clock option is discussed in copending U.S. application Ser. No. 09/004,998 (TI-23099), which is hereby incorporated by reference herein.

When in the self-test mode, data from address buffer 18 is transferred via internal address bus 60 to an enabled test circuit 62. Enabled test circuit 62 is a shift register that stores data identifying a specific test, or group of tests, to be run during the self-test mode. Once the selected test data is stored in enabled test circuit 62, a group of addresses may be stored in an address range register 64. Further details of enable test circuit 62 can be found in copending U.S. application Ser. No. 09/005,081 (TI-23013) which is hereby incorporated by reference herein. Address data can then be tracked using address counter 65.

Also included is a program counter 66 operable to control test sequences. Upon initiation of self-test mode, program counter 66 is reset to its zero state by clock signal B_CLK. Program counter 66 is a sequential logic arrangement in which the next state of program counter 66 is determined by a current state of program counter 66 and the state of data furnished by a Read-only-Memory (ROM) register.

A Read only Memory decoder 70 receives binary signals from program counter 66 via a bus 68. The binary signals are decoded by ROM address decoder 70. In one embodiment, a one out of sixty-four code technique is used to select a row of data from a read only memory 72. In one embodiment, ROM 72 is a sixty-four row read only memory that stores sequences of instruction for controlling routines. In one embodiment, ten test algorithms are stored in ROM 72. Each row address applied form ROM address decoder 70 to ROM 72 accesses a row of data stored therein in response to clock signal B_CLK. One row of data typically makes up one instruction of an algorithm. It is in one of these instructions that a mask release number for SDRAM 10 is stored.

Instructions are outputted from ROM 72 to a data generator 74 which generates the data to be written to or read from memory array 24. A pass/fail circuit 76 compares the data from memory array 24 with the expected data from ROM 72 and data generator 74. When expected data is equivalent to the data from memory array 24, a pass signal is generated. If not, a fail signal is generated. Fail signals are stored in a register (not pictured) and conveyed through data buffer 28 where the results can be read off a pin of SDRAM 10.

Additionally, instructions from ROM 72 are received by timing generator 75 which generates self-test signals such as B_RAS, B_CAS and B_WE, which are the internally generated equivalent of RAS, CAS, and WE. B_CAS, B_RAS and B_WE instructions pass to control signal buffer 36 when in self-test mode. Output multiplexer 77 takes data involving DRAM addresses, control signals, clock information, and data from pass/fail circuit 76 and presents it to DQ buffer 28.

Figure 2:
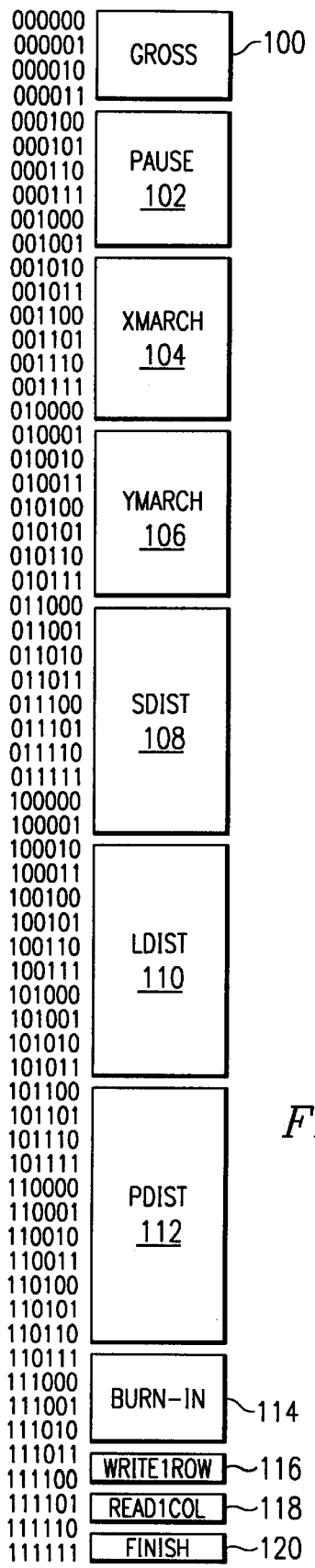
FIG. 2 illustrates read only memory addresses and the corresponding self-tests.

FIG. 2 illustrates read only memory 72 addresses and the corresponding self-tests. In the illustrated embodiment, a total of ten self-tests are provided. In this embodiment, a gross test 100 occupies ROM 72 address 000000 to 000011. Gross test 100 is a write and read test from a full array. A pause test 102 occupies address 000100 to 001000. Pause test 102 tests for data retention. An Xmarch test 104 occupies address 001010 to 010000. Xmarch test 104 writes to one column at a time until the entire memory array 24 is filed. A Ymarch test 106 occupies address 010001 to 010111. Ymarch test 106 writes to one row at a time until the entire memory array 24 is filed. A short disturb test 108 occupies address 011000 to 100001. Short disturb test 108 tests adjacent rows using a disturb algorithm having short cycle timing. Further details of short disturb test can be found in copending U.S. application Ser. No. 09/004,996 (TI-19734) which is hereby incorporated by reference herein. A long disturb 110 occupies address 100010 to 101011. Long disturb test 110 tests adjacent rows using a disturb algorithm having long cycle timing. A page disturb test 112 occupies address 101100 to 110110. Page disturb test 112 tests adjacent rows in a page mode. A burn-in test 114 occupies addresses 110111 to 111010. Burn-in test 114 does a full array burn in. Further details of burn-in test 114 can be found in copending U.S. application Ser. No. 09/004,973 (TI-23823) which is hereby incorporated by reference herein. A write one row test 116 occupies address 111011 to 111100. This test writes to one row. A read one column test 118 occupies address 111101 to 111110. Read one column test 118 reads data from one column. Finally, address 111111 is the end of the self-tests and contains an idle instruction 120 as well as the mask release number for SDRAM device.

Figures 3, 4:
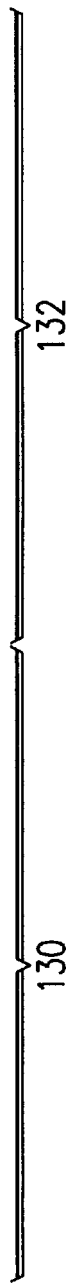
FIG. 3 illustrates the types of instructions for test algorithms.
FIG. 4 illustrates an idle instruction.

FIG. 3 illustrates the types of instructions for the various self-tests. Two major types of instructions exist. The first of the instruction types are program control instructions 142 and the second of the instruction types are array access instructions 140. Program control instructions 142 control the operation of the built-in self-test while array access instructions 140 determine how cells of memory array 24 are to be accessed and written to and/or read from. In one embodiment, both are twelve bit instructions. In array access instructions 140, Read is a command to read a cell, Write is a command to write to a cell, X determines if columns are to be accessed, Y determines if rows are to be accessed, Tset 0 and Tset 1 set the timing of the self-test, Dat determines what data is to be used, ED is the expected data, Ckbd sets the pattern to be read or written, and Alt determines if the address is to be incremented or decremented. For example, if an array access instruction 140 of 101100010000 is given, that would correspond to read X and Y using a specific time set with an expected data of 0.

For program control instructions 142, the first six bits list an instruction and the last six bits are a ROM 72 address. The first four bits of the first six bits are typically 0, and the next two determine the program control type, while the last six bits determine the ROM 72 address to jump to if the first six bits require a jump. The very last instruction in ROM 72 is idle instruction 120 which signals the end of the built-in self-test. For example, idle instruction 120 is 010011 for the first six bits. When this instruction is reached, the built-in self-test is over and the program control sits at an idle state until built-in self-test is exited and normal mode resumes. Since an idle instruction logically does not require a jump, the last 6 bits are unused. Thus, the last six bits of idle instruction 120 may be used in any manner such as for storing the mask release number for SDRAM 10.

FIG. 4 illustrates idle instruction 120. The first six bits are the idle instruction 130. The second six bits are the mask release number 132. In another embodiment, any other information that can be encoded in six bits can be stored in the same way such as chip lot number, wafer number, die number, fail and repair information, manufacturing date, device type, or any other similar type of data. Additionally, since the concept is storing a mask release number within an idle instruction in ROM, this approach is independent of built-in self-test schemes and could be implemented using a boot ROM or BIOS ROM or similar implementation.

Once mask release number is stored in ROM 72, it can be read using a read mode to external address pins for verification.

Thus, it is apparent that there has been provided, in accordance with the present invention, a ROM embedded mask release number built-in self-test that satisfies the advantages set forth above. Although an exemplary embodiment has been described in detail, it should be understood that various changes, substitutions, and alterations may be apparent to those skilled in the art and may be made herein to the systems and methods discussed without departing from the spirit and scope of the present invention as solely defined by the appended claims.

What is claimed is:

1. A memory system for storing identification information, comprising:

a random access memory area;

a built in self test area operable to perform diagnostic tests on the memory area, the built in self test having:

a read only memory area comprising a plurality of instructions; and wherein at least one instruction is an idle instruction that includes identification information that includes a mask release number.

2. A method for providing identification information in an integrated circuit, comprising the steps of:

providing a fixed amount of non-volatile memory;

providing an idle instruction for the memory;

associating the idle instruction with identification information that includes a mask release number.

* * * * *